(12) United States Patent
Eveleigh

(10) Patent No.: US 11,266,047 B2
(45) Date of Patent: Mar. 1, 2022

(54) ISOLATION ASSEMBLY FOR AN ELECTROACOUSTIC DEVICE

(71) Applicant: Magarl, LLC, Naples, FL (US)

(72) Inventor: Robert B. Eveleigh, Naples, FL (US)

(73) Assignee: Magarl, LLC, Naples, FL (US)

( * ) Notice: Subject to any disclaimer, the term of this patent is extended or adjusted under 35 U.S.C. 154(b) by 0 days.

(21) Appl. No.: 16/852,720

(22) Filed: Apr. 20, 2020

(65) Prior Publication Data

US 2020/0337186 A1 Oct. 22, 2020

Related U.S. Application Data

(60) Provisional application No. 62/836,400, filed on Apr. 19, 2019.

(51) Int. Cl.
*H05K 9/00* (2006.01)
*H04R 1/02* (2006.01)
*G10K 11/162* (2006.01)

(52) U.S. Cl.
CPC ............ *H05K 9/0007* (2013.01); *H04R 1/02* (2013.01); *G10K 11/162* (2013.01); *H04R 2420/07* (2013.01)

(58) Field of Classification Search
CPC .... H05K 9/0007; H04R 1/02; H04R 2420/07; G10K 11/162
See application file for complete search history.

(56) References Cited

U.S. PATENT DOCUMENTS

| | | | |
|---|---|---|---|
| 3,728,741 A | 4/1973 | Lepor | |
| 5,875,890 A | 3/1999 | De Bernardini | |
| 8,724,020 B1 | 5/2014 | Haddad | |
| 9,654,167 B1 | 5/2017 | White et al. | |
| 10,021,228 B2 | 7/2018 | Ageishi | |
| 10,038,950 B2 * | 7/2018 | Avliav | ................. G10K 11/161 |
| 10,543,466 B2 * | 1/2020 | Wu | ...................... B01F 13/0084 |
| 10,856,074 B2 * | 12/2020 | Zimmerman | ............ H04R 3/00 |
| 2004/0259602 A1 | 12/2004 | Zack | |
| 2006/0215835 A1 | 9/2006 | Snodgrass | |
| 2009/0202064 A1 | 8/2009 | Snodgrass | |
| 2010/0128884 A1 | 5/2010 | Sapiejewski et al. | |
| 2011/0198245 A1 | 8/2011 | Soufan | |
| 2016/0102951 A1 * | 4/2016 | Cole | ..................... F41H 5/0492 |
| | | | 361/679.34 |
| 2016/0198781 A1 | 7/2016 | Israel et al. | |
| 2016/0233912 A1 | 8/2016 | Thomas et al. | |

(Continued)

FOREIGN PATENT DOCUMENTS

WO 2019022750 1/2019

OTHER PUBLICATIONS

Silver, Curtis, "This Alexa Fitted Condom Protects Your Most Intimate Moments," https://www.forbes.com/sites/curtissilver/2019/08/08/this-alexa-fitted-condom-protects-your-most-intimate-moments/#354fead3af34, 4 pgs Jun. 8, 2020.

(Continued)

*Primary Examiner* — Andrew L Sniezek

(74) *Attorney, Agent, or Firm* — John V. Daniluck; Dentons Bingham Greenebaum LLP

(57) ABSTRACT

Methods and apparatus for acoustically and electronically isolating a smart speaker to prevent unauthorized persons from using the smart speaker microphones to eavesdrop and intrude into a personal space.

30 Claims, 12 Drawing Sheets

(56) References Cited

U.S. PATENT DOCUMENTS

2017/0042265 A1   2/2017  Goussev et al.
2017/0105118 A1   4/2017  Lee
2020/0312291 A1*  10/2020 Barski ..................... H04R 1/34
2021/0051471 A1*  2/2021  Mai ..................... G06F 21/6245

OTHER PUBLICATIONS

USPTO (ISA), PCT/US2020/028924, Search Report & Written Opinion, 10 pgs dated Jul. 15, 2020.
Kircher, Madison Malone, "'Hearmuffs' Are to Your Amazon Echo What Tape is to Your Webcam," New York Magazine: Intelligencer, 3 pgs Apr. 16, 2017.

* cited by examiner

US 11,266,047 B2

ISOLATION ASSEMBLY FOR AN ELECTROACOUSTIC DEVICE

CROSS REFERENCE TO RELATED APPLICATION

This application claims the benefit of priority to U.S. Provisional Patent Application Ser. No. 62/836,400, filed Apr. 19, 2019, incorporated herein by reference.

FIELD OF THE INVENTION

Various embodiments of the present invention pertain to methods and apparatus for providing localized isolation to an electronic device, and in some embodiments for acoustically and electromagnetically disrupting a smart speaker.

SUMMARY OF THE INVENTION

Various embodiments of the inventions described herein pertain to apparatus and methods for providing at least partial isolation to an electronic device such as a smart speaker from ambient acoustic noise and ambient wireless signals. It has been reported that some of the companies that produce or support electronic devices such as smart speakers have used the microphones of the smart speaker for unauthorized listening to conversations taking place around the smart speaker. A still further problem pertaining to smart speakers is with regards to the microphone on and off switch. Some modern on and off switches used with a computer do not open or close a circuit, as was common with old fashioned on and off switches. In such modern computer-oriented switches, the actuation of the switch by the user is simply another command to the computer (or to an analog circuit) that the function (in this case, the microphone) should be turned off. However, it by no means guarantees that it will be turned off.

Various embodiments of the present invention pertain to apparatus and methods useful for preventing, obscuring, or minimizing the reception of ambient sound by an electronic device, such as a smart speaker. In some embodiments, the apparatus includes a sound absorbing member that is placed over the microphone ports of the device. This sound reducing member comprises a material that is not a good transmitter of sound. Therefore, any ambient noise reaching the sound absorbing layer is muted by the sound absorbing member before reaching the microphones.

In still further embodiments, the apparatus includes a member, layer, or coating, that, when placed on the microphone ports easily conforms into the shape of the port, thus providing a seal of the port that discourages any leakages of ambient sound through a gap.

Still further embodiments include an outer cover that is weighted, and applies this weight into the sound reducing member and/or the microphone port cover. In still further embodiments, the device can include a separate weight that presses onto the top of the sound reducing members and/or microphone port, such as a plate.

Still further embodiments include a covering material that is adapted and configured to both cover the electronic device, and also minimize transmission of sound through the cover. Examples of such covers include weighted blankets, shipping blankets, sheets of butyl rubber or elastomers, or various commercially available sound reducing materials such as the PIG absorbent mats, DynaPad, Dynaliner, and Dynamat Xtreme materials.

Still further embodiments include devices and methods for impairing the wireless connection between the electronic device and other wirelessly transmitting and receiving devices. In some devices, this electronically conductive shield is adapted and configured to shield the smart speaker from wireless signals in the range of about two gigahertz to about five gigahertz (for current Wi-Fi), or any other frequency band of interest.

In some embodiments the device includes a full or partial Faraday shield, the shield comprising an electrically conductive material, and being either continuous or in the form of a mesh.

BRIEF DESCRIPTION OF THE DRAWINGS

Some of the figures shown herein may include dimensions. Further, the figures shown herein may have been created from scaled drawings, scaled models, or from photographs that are scalable. It is understood that such dimensions, or the relative scaling within a figure, are by way of example, and not to be construed as limiting unless so stated in a claim. Persons of ordinary skill will also recognize that CAD renderings may include lines that pertain to changes in surface geometry, and not necessarily to component features.

FIGS. 1A-11 are various perspective photographic representations of smart speakers.

FIG. 2 is a side elevational view of an isolation apparatus placed over a smart speaker according to one embodiment of the present invention.

FIG. 3 is a cutaway view of the apparatus of FIG. 2.

FIG. 4 is a top plan view of the isolation assembly of FIG. 2, fully expanded.

FIG. 5 is a cutaway view of an isolation assembly according to another embodiment of the present invention placed over a smart speaker.

FIG. 6 is a side elevational cross sectional representation of an isolation apparatus according to another embodiment of the present invention, placed over the top of a smart speaker.

FIG. 7 is a side elevational cross sectional representation of an isolation apparatus according to yet another embodiment of the present invention, placed over the top of a smart speaker.

ELEMENT NUMBERING

Figure 1A:
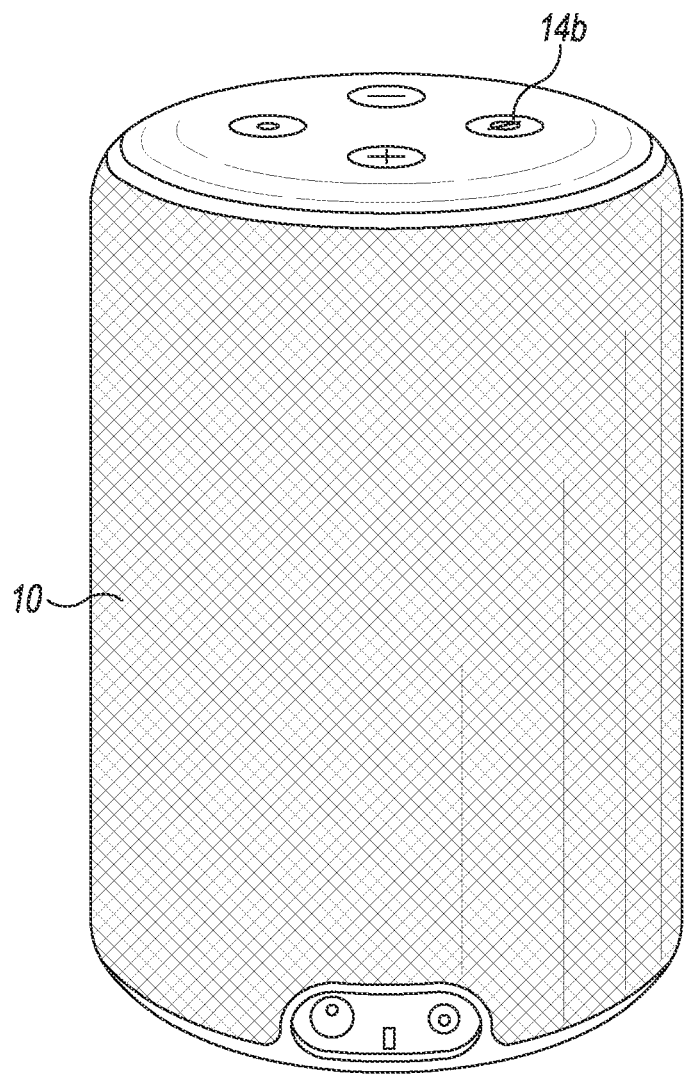
Figure 1B:
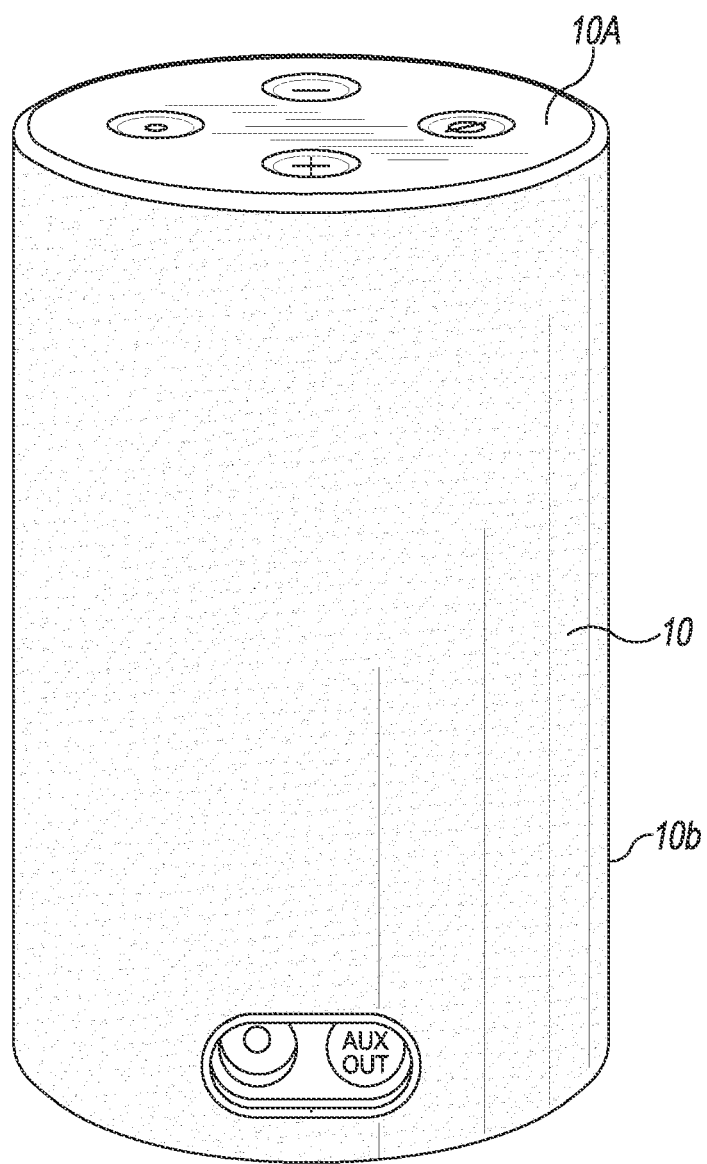
Figure 1C:
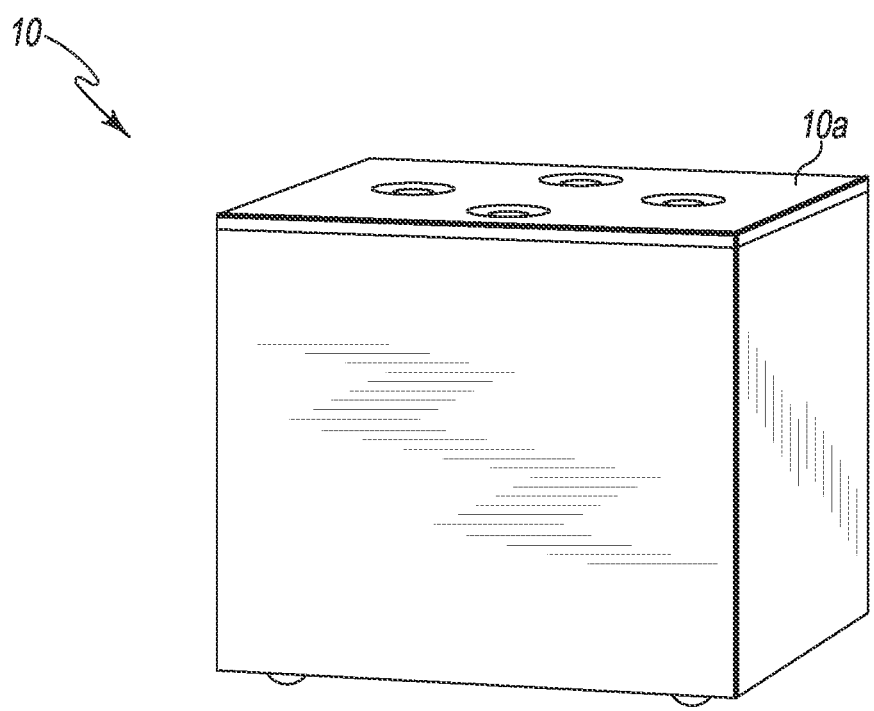
Figure 1D:
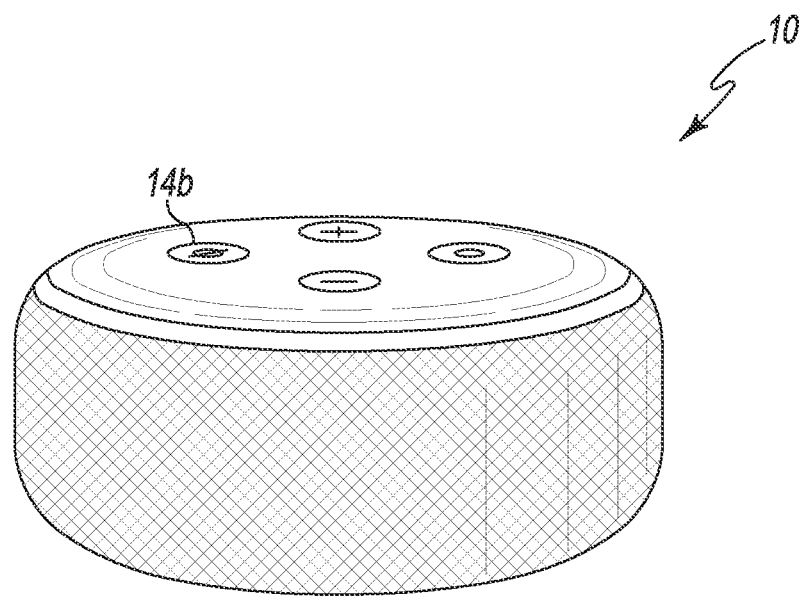
Figure 1E:
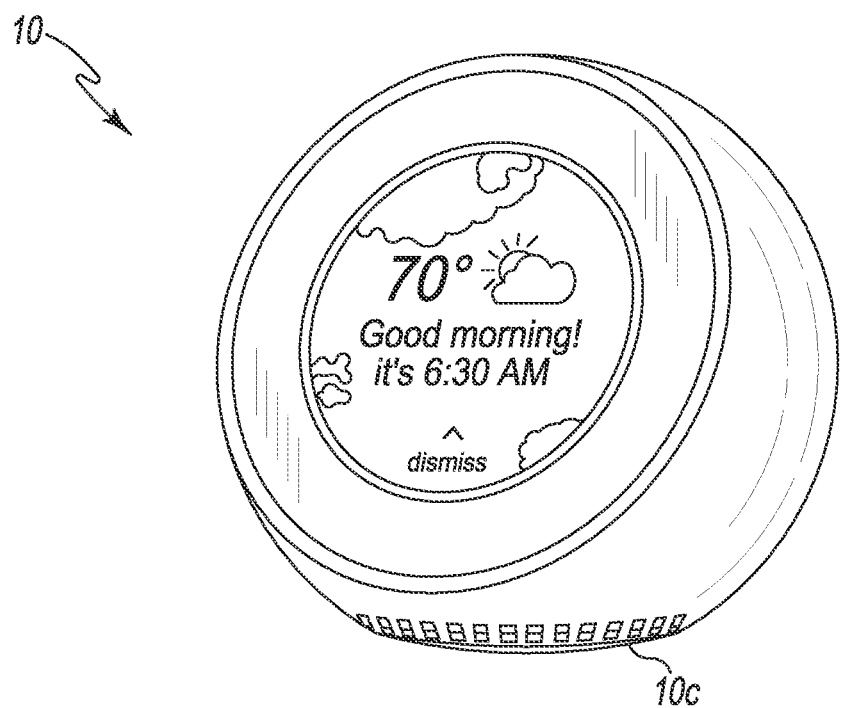

The following is a list of element numbers and at least one noun used to describe that element. It is understood that none of the embodiments disclosed herein are limited to these nouns, and these element numbers can further include other words that would be understood by a person of ordinary skill reading and reviewing this disclosure in its entirety.

| | |
|---|---|
| 10 | smart speaker |
| a | top |
| b | sides |
| c | base |
| 14 | microphone |
| a | microphone port |
| b | microphone switch |
| 16 | wireless device |
| 20 | isolation assembly |
| 22 | outer material; cover |
| a | top |
| b | sides; middle |

-continued

| | |
|---|---|
| c | base |
| 24 | pleats |
| 26 | central area |
| a | top pocket |
| 27 | non-central area |
| 28 | pocket |
| 30 | sound reducing, isolating, or absorbing member |
| a | first |
| b | second |
| 32 | plate; weight |
| 36 | casing |
| 38 | microphone port cover |
| 40 | weight |
| 42 | compartment |
| 44 | separate weight |
| 50 | electrically conductive shield |
| a | top |
| b | sides |
| c | base |
| 52 | separations |

DETAILED DESCRIPTION OF ONE OR MORE EMBODIMENTS

For the purposes of promoting an understanding of the principles of the invention, reference will now be made to the embodiments illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates. At least one embodiment of the present invention will be described and shown, and this application may show and/or describe other embodiments of the present invention, and further permits the reasonable and logical inference of still other embodiments as would be understood by persons of ordinary skill in the art.

It is understood that any reference to "the invention" is a reference to an embodiment of a family of inventions, with no single embodiment including an apparatus, process, or composition that should be included in all embodiments, unless otherwise stated. Further, although there may be discussion with regards to "advantages" provided by some embodiments of the present invention, it is understood that yet other embodiments may not include those same advantages, or may include yet different advantages. Any advantages described herein are not to be construed as limiting to any of the claims. The usage of words indicating preference, such as "various embodiments" or "preferably," refers to features and aspects that are present in at least one embodiment, but which are optional for some embodiments, it therefore being understood that use of the word "preferably" implies the term "optional.".

The use of an N-series prefix for an element number (NXX.XX) refers to an element that is the same as the non-prefixed element (XX.XX), except as shown and described. As an example, an element 1020.1 would be the same as element 20.1, except for those different features of element 1020.1 shown and described. Further, common elements and common features of related elements may be drawn in the same manner in different figures, and/or use the same symbology in different figures. As such, it is not necessary to describe the features of 1020.1 and 20.1 that are the same, since these common features are apparent to a person of ordinary skill in the related field of technology. Further, it is understood that some features 1020.1 and 20.1 may be backward compatible, such that a feature of a later discussed embodiment (NXX.XX) may include features compatible with other various embodiments that were discussed earlier (MXX.XX), as would be understood by those of ordinary skill in the art. This description convention also applies to the use of prime ('), double prime ("), triple prime ("') and star or asterisk (*) suffixed element numbers. Therefore, it is not necessary to describe the features of 20.1, 20.1', 20.1", 20.1'" and 20* that are the same, since these common features are apparent to persons of ordinary skill in the related field of technology.

Although various specific quantities (spatial dimensions, temperatures, pressures, times, force, resistance, current, voltage, concentrations, wavelengths, frequencies, heat transfer coefficients, dimensionless parameters, etc.) may be stated herein, such specific quantities are presented as examples only, and further, unless otherwise explicitly noted, are approximate values, and should be considered as if the word "about" prefaced each quantity. Further, with discussion pertaining to a specific composition of matter, that description is by example only, and does not limit the applicability of other species of that composition, nor does it limit the applicability of other compositions unrelated to the cited composition.

This document may use different words to describe the same element number, or to refer to an element number in a specific family of features (NXX.XX). It is understood that such multiple, different words are not intended to provide a redefinition of any language herein. It is understood that such words demonstrate that the particular feature can be considered in various linguistical ways, such ways not necessarily being additive or exclusive.

Various embodiments disclosed herein pertain to method and apparatus for acoustically and electromagnetically providing at least partial isolation of an electroacoustic device, such as a smart speaker, or any other device having both a microphone and the ability to wirelessly communicate. Various embodiments pertain to means for reducing the transmission of sound into the microphone, partially or completely covering the microphone ports, and providing electromagnetic shielding.

In some embodiments, the apparatus and methods pertain to a pliable, flexible material that can be draped over a smart speaker, and simultaneously provide both acoustic isolation and electromagnetic isolation. In such embodiments, the material may be in one example a weighted blanket having poor transmissibility of sound. Further, the blanket may have an electrically conductive inner surface or outer surface that impedes electromagnetic communication. Such blanket-type covers are useful in terms of providing isolation to a variety of different shapes and sizes of smart speakers.

In still other embodiments, the apparatus and methods pertain to covering devices that have a more distinct form and shape that is adapted and configured to fit snugly over the top of the smart speaker, or to whatever portion of the smart speaker includes the microphones. In such embodiments, the basic shape of the device may be a casing fabricated from relatively dense, resilient material. The electrically conductive shield can cover the inside of the casing, the outside of the casing, or be molded into the casing.

Still further embodiments of the present invention pertain to devices and methods that are part pliable blanket, and part distinct shape. In such embodiments, the distinctively shaped portions of the device are sized to cover a range of microphone port spacings for different smart speakers. Further, preferably these sound reducing members have greatly reduced stiffness, either by means of material selection and/or material thickness (such that the sound reducing members are substantially "deadweight" or "limp," being neither particularly firm, nor particularly stiff. An example of a limp device would be a rubber band, especially a cut rubber band. In such embodiments, the limp structure of the sound reducing member is useful in providing conformance of the member to the external shape of the smart speaker.

In such embodiments including the shape of the sound isolating member preferably conforms by its own weight to the top of the electronic device. However, in some devices, weights can be incorporated into a device cover that further assist in pressing the sound isolating member onto the shape of the area of the smart speaker having microphone ports. In some embodiments, this weight is applied on top of the sound isolating members, and compresses these members directly.

In still further embodiments, the weight is applied to the sound isolating members by means of a weighted cover. However, some weighted covers have a stiffness in compression that could support part of the weight of the cover (or blanket), should the cover touch a supporting surface such as a table top. In such cases, the weight is supported by the table, and is not compressing the sound isolation members. Therefore, some embodiments include devices and methods in which the cover is adapted and configured to substantially not transmit compression.

Some such embodiments include placement of discrete weights on a flexible blanket type material, such that the blanket is a material (such as cotton or nylon) that is pliable and flexible. By attaching weights to such a cover at discrete locations, the weights themselves are prevented from providing compressive stiffness to the outer cover. Further the separate weights can be attached at several discrete locations on the blanket, such that if the blanket is too large for a small smart speaker, then only some of the weights will be supported on the table, and the remainder of the weights (those closer to the center) will still be draped over the sides of the smart speaker, tensioning the cover and reacting the weight onto the sound reducing members.

Figure 2:
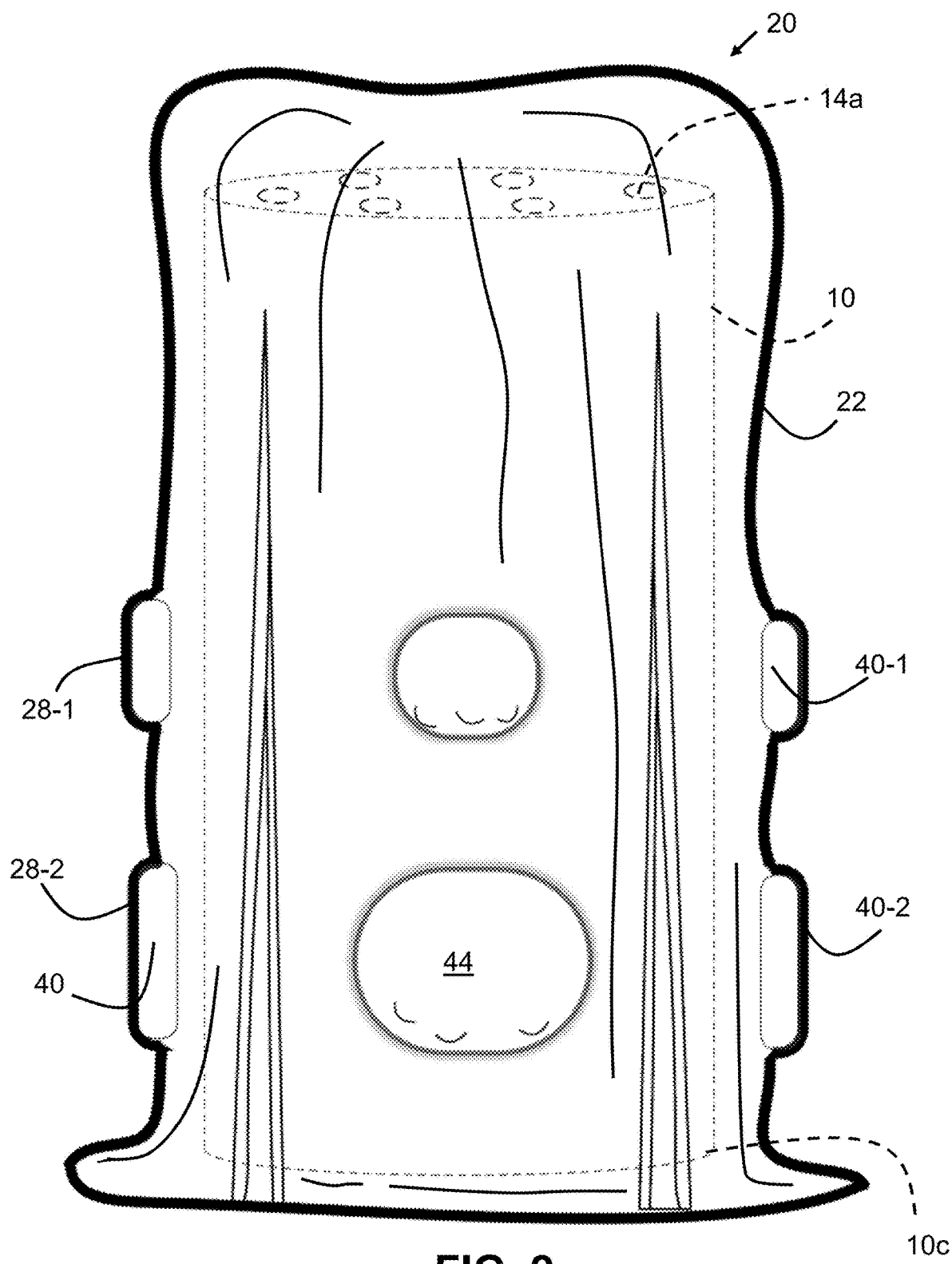

In these aforementioned embodiments (and as shown in FIG. 2), the weighted cover is adapted and configured to provide tension only, and for that tension to establish a net compressive load that is reacted by the sound isolating layers. By selecting the cover material to be pliable and flexible, the loads of the weights are internally supported on the cover by membrane loading. A further example of membrane loading is in the aforementioned pliable, limp sound isolating members. Such limp members preferably have so little stiffness that as they conform to the surface of the top of the device, that the sound absorbing members are likewise loaded as membranes.

In still further embodiments, it is helpful to at least partially seal the microphone ports from the ambient air. In such embodiments, the device's methods include a layer of very soft material that preferably directly contacts the top of the smart speaker. One example of such a soft material would be the gel material used for some shoe insoles. Preferably, such layers a durometer less than about Shore 00 40.

Figure 3:
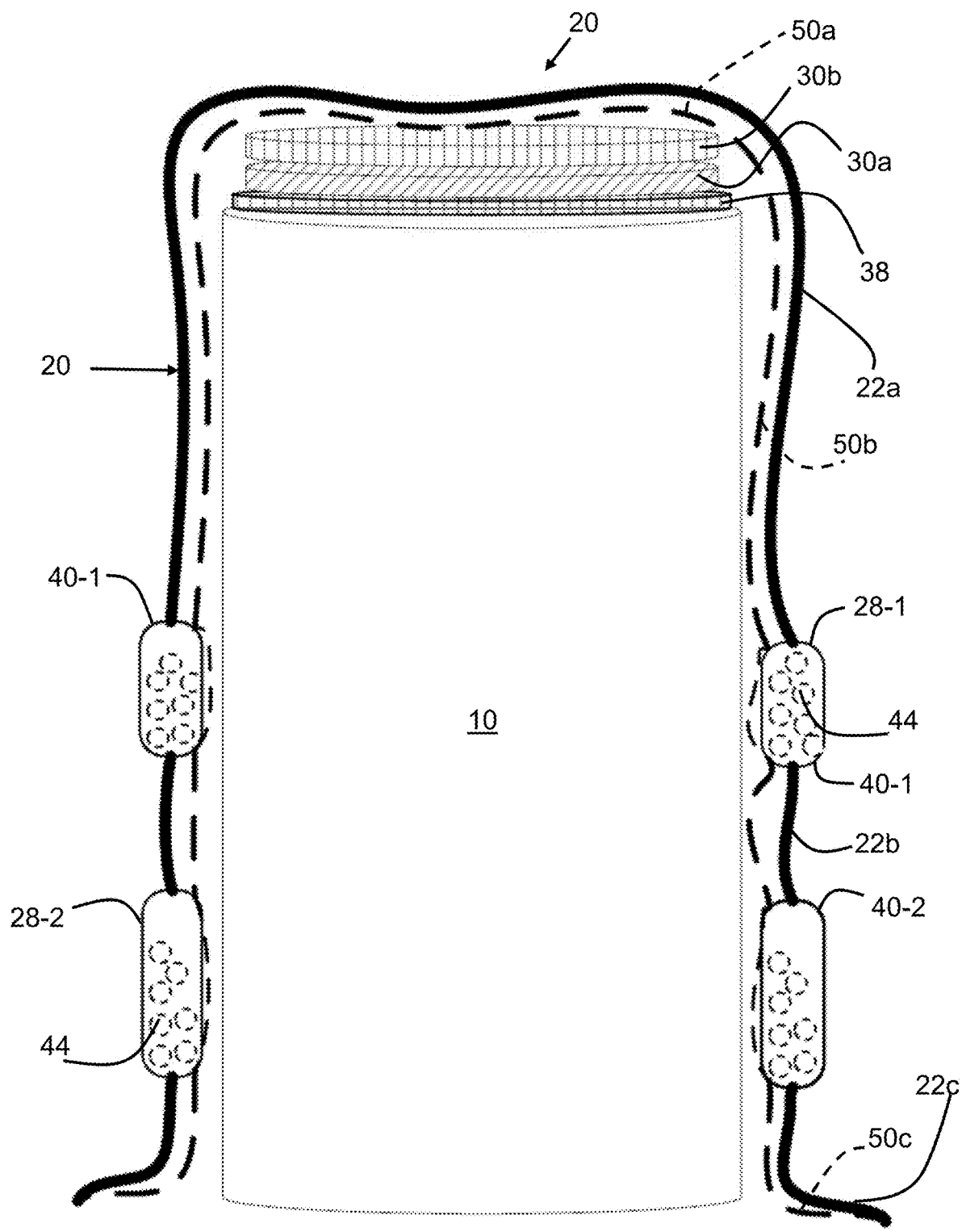
Figure 4:
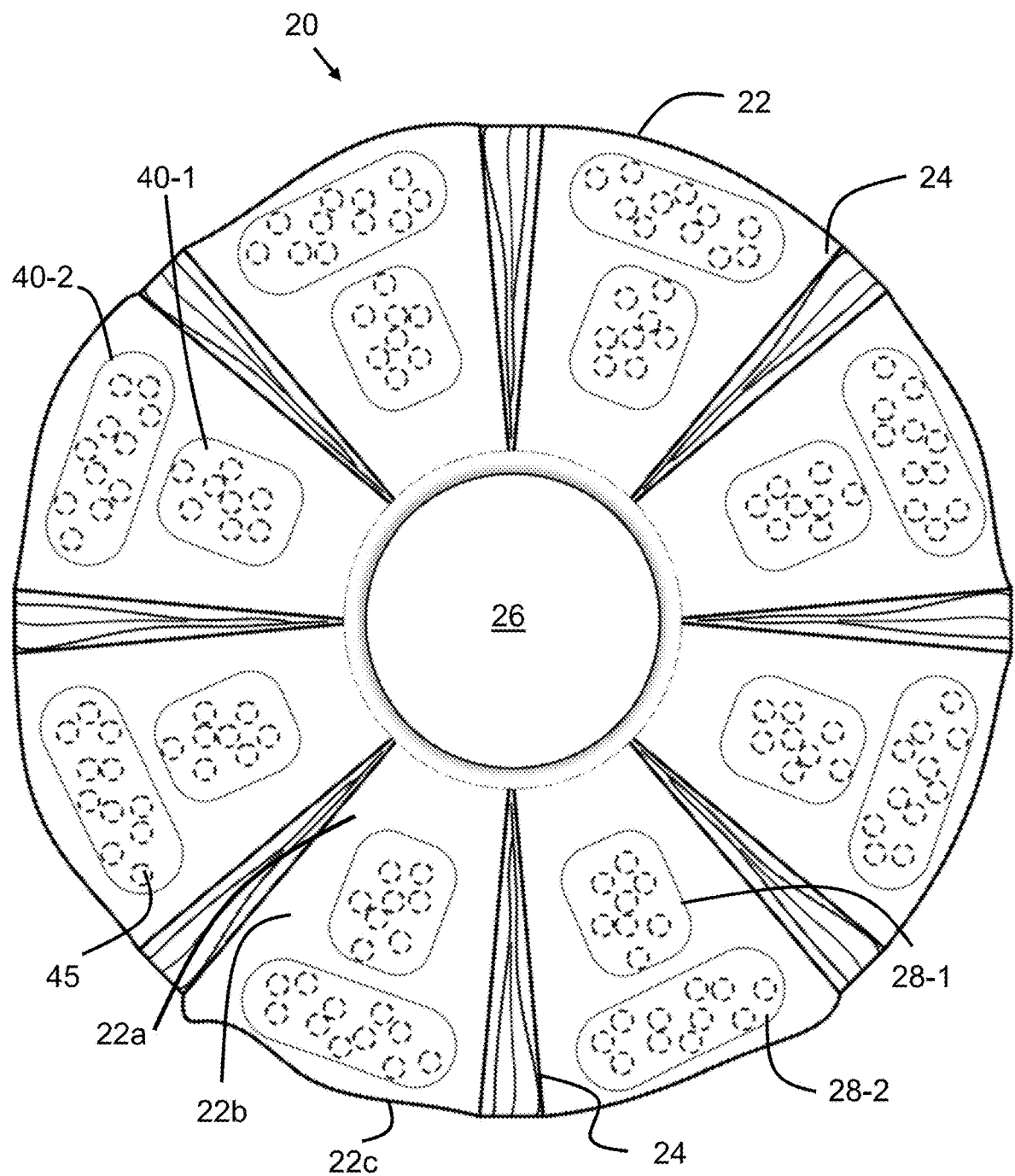

FIGS. 2-4 show various views of an isolation assembly 20 according to one embodiment of the present invention. Assembly 20 is adapted and configured to cover at least portions of some of the various electronic devices 10 shown in FIG. 1. It is understood that because of the wide variety of shapes, that some shapes may be only partially covered by the assemblies X20 shown herein. Assemblies X20 are adapted and configured to at least partially isolate a microphone of a device 20 from ambient sounds, and further to at least partially electromagnetically isolate a device 20 from receiving electromagnetic signals. It is further understood that with the wide variation in devices 10 of their acoustic sensitivity and wireless signal sensitivity, that different assemblies X20 may not impede the operation of the microphone or wireless receiver of the device 10 so as to completely stop its operation, especially considering that there can be significant variations in the level of ambient acoustic sound pressures and ambient electromagnetic radiation.

FIG. 2 shows an isolation assembly 20 closed over a device 10 according to one embodiment of the present invention. Assembly 20 includes an outer cover 22 having a top portion 22a that covers corresponding top portion 10a of a smart speaker, a bottom or base portion 22c that preferably, but not necessarily, surrounds the base 10c of the electronic device, and a middle section 20b extends between the top and base sections 20a and 20c, respectively. Referring briefly to FIG. 4, it can be seen that in some embodiments the cover 22 has a generally circular plan form, although other embodiments of the present invention are not so constrained.

Preferably, cover 22 is fabricated from an outer material that is selected to be sufficiently pliable to generally conform to the top 10a of the electronic device 10. Still further, this outer cover is preferably unable to resist compression, such that in those circumstances where the assembly X20 is placed over an electronic device, that if the base 22c of the cover comes into contact with another surface (such as a table top), that this contact does not substantially interfere with the ability of the cover to loosely and limply drape over the outer shape of the electronic device and act as "deadweight" on the device 10. Referring to FIG. 3, the contact and spreading out the base 22c on a table top preferably does not change the state of tension in the middle section 22b, nor in the top section 22a.

In some embodiments, cover 22 is preferably fabricated from a pliable material such as natural or man-made cloth (cotton, rayon, nylon, linen, polyester, velvet, silk, wool, chiffon, acetate, acrylic, natural or synthetic rubbers including spandex, or other). Still further, in some embodiments the outer cover 22 is fabricated from electrically conductive material, including carbon or graphite sheet. Still further, in yet other embodiments the material of cover 22 is interwoven with electrically conductive material, including filaments of carbon fiber, copper, aluminum, and the like.

Still further, the cover 22 can be fabricated from a composite assembly such as a weighted blanket. In such embodiments, the material (such as any of those discussed above) is adapted and configured to be filled with objects 44 such as pellets, disks, or beads comprising plastic, glass, or metals. In such embodiments, the cover 22 can include one or more discrete compartments in which the filler material is placed. Preferably, the filler material is loosely placed in the compartment. Referring to FIGS. 3 and 4, it can be seen that the weights 40-1 and 40-2 in some embodiments comprise a plurality of individual weights. In assembly 20, each of the pockets 28 of cover 22 have one or more discrete weights 44. As one example, these weights can be of any type, including steel shot, lead pellets, glass beads, or the like.

Referring again to FIGS. 2 and 4, in some embodiments the outer cover 22 includes one or more pleated areas 24. These pleated areas assist in establishing at least the top portion 22a of the cover in a form-fitting, dead weight manner around the electronic device 10. In the expanded cover shown in FIG. 4, it can be seen that the cover 22 has a planform shape that is preferably substantially larger than the planform shape of the electric devices 10 shown in FIG. 1, when viewed from the top. In this manner of shaping and sizing of the cover 22, an isolation assembly X20 can preferably provide sufficient coverage of a thinner cylindrical device such as that shown in FIG. 1B, for a more squat electrical device such as that shown in FIG. 1D, a rectangular device such as that shown in FIG. 1C, or still other shapes such as those shown in FIG. 1E, 1G, or 1H. Various embodiments of the present invention contemplate isolation assemblies X20 including covers X22 fabricated from a uniformly weighted material, and in yet further embodiments a material that is electrically conductive, or combined with a material that is electrically conductive in a uniform matter. The embodiments shown in FIGS. 2-7 include covers X20 in which the weighting of the cover is accomplished in discrete portions of the cover, and further in which the electrically conductive shield is separate from the material of the cover.

Referring to FIGS. 2-4, it can be seen that assembly 20 includes a first plurality of discrete weights 40 that are distributed circumferentially about a central area 26 of cover 22. In some embodiments, these weights 40-1 are distributed generally uniformly around the circumference of central area 26, and generally placed at a first radial distance from the central area. However, yet other embodiments of the present invention are not so constrained, and contemplate one or more discrete weights located anywhere on cover 22.

Isolation assembly 20 preferably includes a second plurality of weights 40-2 that in some embodiments are placed uniformly and circumferentially at a second, greater radius from the central area 26. It is further understood that still other embodiments contemplate at least one discrete weight 40-2 that is spaced apart from the at least one discrete weight 40-1.

By having one or more weights placed a first, closer distance to the central area than one or more of a second set of weights placed at a further radial distance from the central area and spaced apart from the first weight, various embodiments of the present invention can be adapted to use on multiple configurations and sizes of electronic devices, while still maintaining tension in the top 22-a of the cover. Referring to FIG. 2, it can be seen that both the first plurality of weights 40-1 and the second plurality of weights 40-2 are located above the table (not shown) that supports the electronic device and the assembly 20. Since the cover base 22c loosely drapes onto the table toward base 10c, the full weight of both the first plurality of weights 40-1 and the second plurality of weights 40-2 are applied to the top 22a of cover 22, and not supported by the table top.

However, if this same size and geometry of cover were applied to a shorter electronic device having a base 10c closer to the middle 22b between the spaced apart weights 40-1 and 40-2 (as best seen on the right side of FIG. 3), the spaced apart, rows of weights 40 separated by compression-weak material 22b still provides loading of the top of device 10. In such a case, the bottom plurality of weights 40-2 would be in contact with the top of the table, and these weights would have little or no effect on the state of tension within the top 22a of cover 22. However, the top plurality of weights 40-1 would not be in contact with the top of the table, such that these weights 40-1 would still apply a state of tension to the top 22a of cover 22. Therefore, by having discrete weights that are spaced apart at different radii from the central section 26, various embodiments of the present invention can provide tension to top area 22, such that these discrete weights not in contact with the table top would have their weight supported by the top 10a of the electronic device 10.

Referring to FIG. 3, it can be seen that the top 22a of cover 22 has attached to it one or more sound deadening or sound reducing members 30. The sound reducing member 30 comprises a material that is adapted and configured for obstructing the transmission of sound through the member. In some embodiments, the member 30 comprises a relatively dense material, and preferably a material that can be made to conform to the top surface 10a of the electronic device 10. Examples of such materials include various elastomers (such as butyl rubber) and also various engineered devices including weighted blankets and other sound deadening materials. Examples include the Quiet Barrier™ sound proofing material produced by soundproofcow; the Sound Absorption sheet, the isole sound absorber or the Peacemaker® sound barrier all made by Audimute; the PIG absorbent mats, DynaPad, Dynaliner, and Dynamat Extremecing materials produced by Dynamic Control of North America, Inc.; the Q-Mat™ by Soundqubed; and Noico Sound Deadening material by Noico Solutions. Further contemplated are weighted blankets, preferably those including a uniform layer of dense material as well as weights (such as steel shot over a layer of elastomer).

In the embodiment shown in FIG. 3, two sound reducing members 30a and 30b are located at and attached to the top 22a of cover 22. Preferably, these two layers are loose (not attached) relative to each other, so as to increase the thickness of the sound reducing layer 30, but at the same time not increase the stiffness of the member by having a single layer of greater thickness. By having two layers that are able to move and conform relative to each other, the sound reducing layer more readily conforms to the shape of the top 10a of electronic device 10. Those embodiments incorporating multiple, thinner sound reducing members (in contrast to a single member of the same overall thickness) can be useful in achieving a sound reducing layer that works successfully on the top of an electronic device such as that shown in FIG. 1B, and at the same time for a device shown as in FIG. 1F. The thinner multiple layers provide more deadweight effect than a single thicker layer of the same material.

Figure 1F:
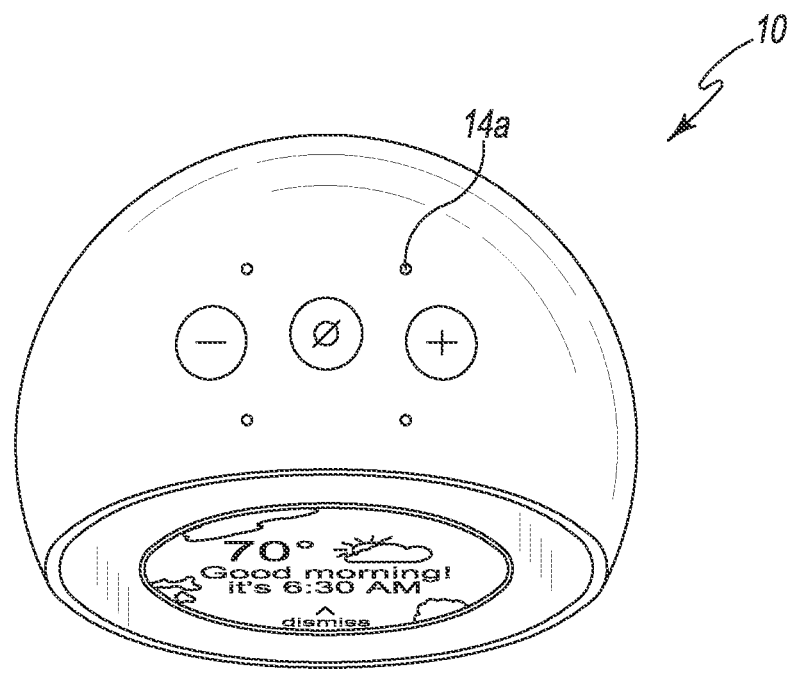
Figure 1G:
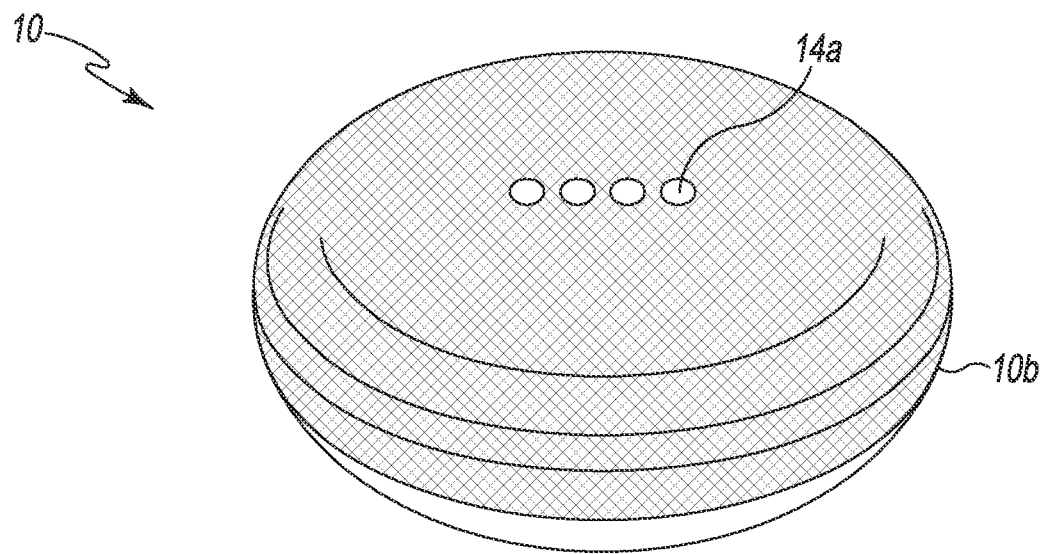
Figure 1H:
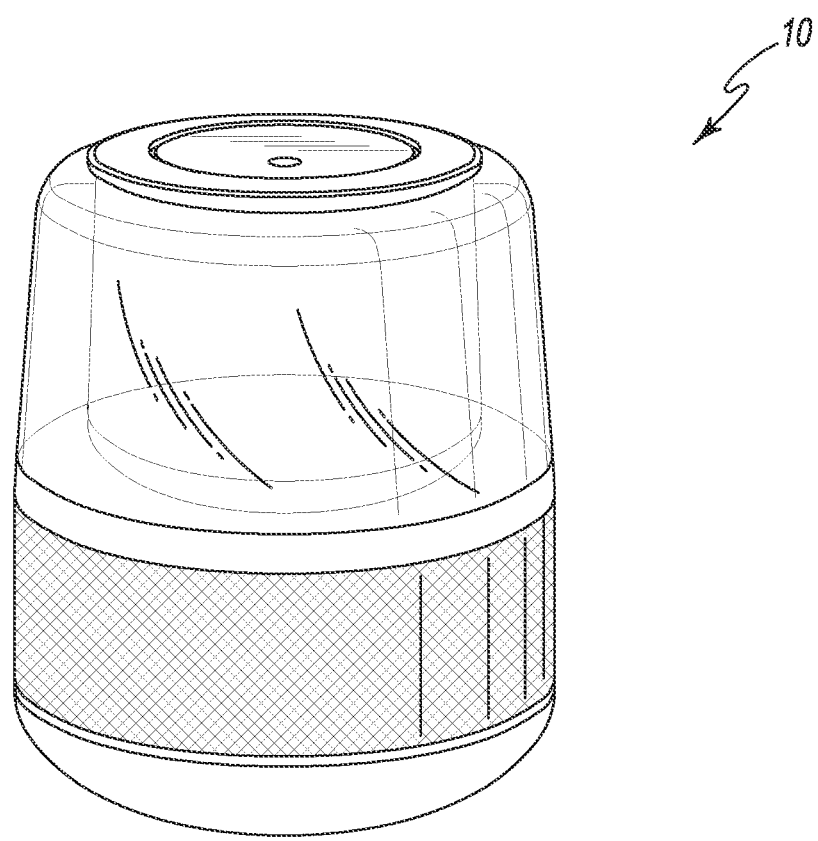
Figure 1I:
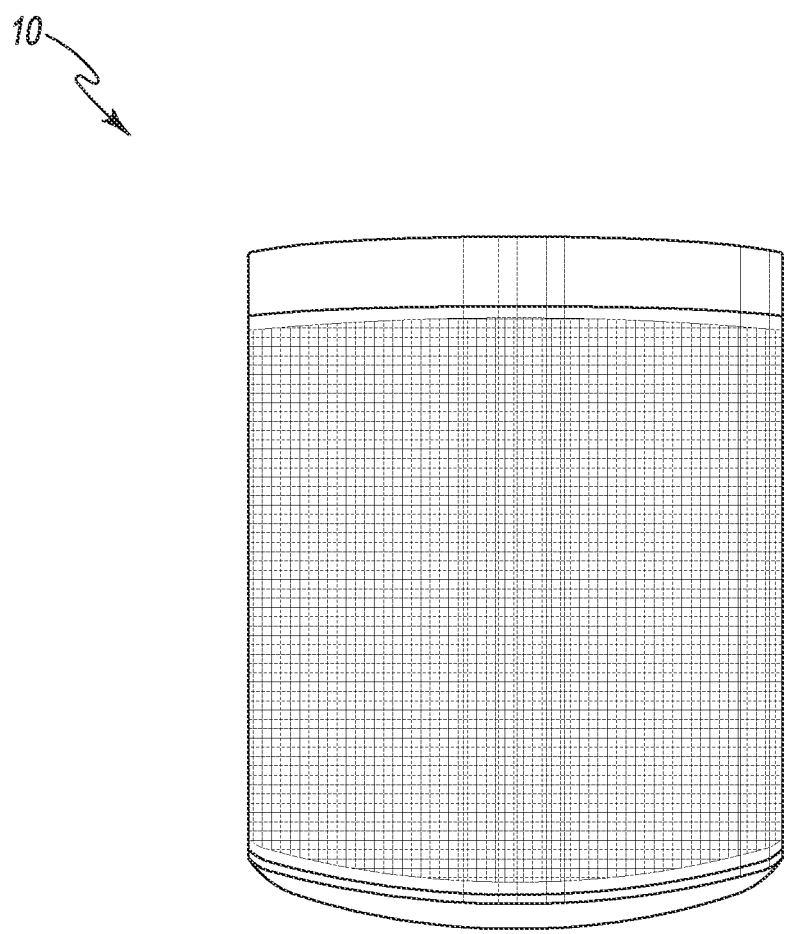

The top of the isolation assembly 20 in some embodiments also includes a microphone port cover 38 that is adapted and configured using material that can conform and block small features on the top of the device 10, such as the microphone ports 14a shown in FIG. 2 and FIG. 1F. In such embodiments, this microphone port covering member is sufficiently soft so as to be partially squeezed into the top of the microphone port, thus providing at least a partial seal of the microphone from ambient sound that would otherwise leak in. It is preferred that this material be relatively soft. Examples of such materials include foam rubber, the types of elastomers used in soft rubber bands, and the types of materials used in gel shoe insoles. Preferably, this layer has a durometer of less than Shore A40, and preferably less than Shore 00 40.

Referring to FIGS. 2, 3, and 4, it can be seen that assembly 20 in some embodiments includes an electrically conductive shield 50. Preferably, this shield includes top 50a, middle 50b, and base 50c portions, and is generally coextensive with the shape of cover 22. Electrically conductive shield 50 is adapted and configured to attenuate the wireless communication between device 10 and other nearby electronic devices. Preferably, the shield is useful in attenuating the inbound wireless signal from an outside source to device 10.

Because of the potential distance between device 10 and the broadcasting device, as well as the geometry of the ambient setting, these inbound signals can be weaker than the signals that are broadcast from device 10 (especially for those devices 10 that receive power from an outside source). Although yet other embodiments of the present invention are adapted and configured to minimize and disrupt the signal being broadcast by device 10, in those embodiments in which the incoming signal is disrupted this disruption can lead to a sensed lack of communication from the broadcasting device. With this sensed lack of communication, or simple miscommunication, the remote broadcasting device may stop trying to interpret signals being broadcast by device 10. In such embodiments and applications, partial electronic shielding (or partial Faraday shields) are useful, and full shielding is not required.

Preferably, shield 50 extends completely over and surrounds device 10. It is further preferable that the base 50c of the shield be in contact with an electrically grounded surface. In such environments, shield 50 can act as a properly functioning Faraday shield as to those frequencies for which the shield has been adapted and configured. Preferably, the shield is adapted and configured to attenuate wireless signals such as those used in Wi-Fi, including those frequencies established by IEEE 802.11A, and generally to those frequencies from about two gigahertz to about five gigahertz. However, yet other embodiments contemplate the attenuation of electromagnetic signals at any frequencies or wavelengths.

In some embodiments, the shield 50 comprises an electrically conductive material such as copper, aluminum, carbon, and the like. Preferably, the shield in some embodiments is constructed from a wire mesh of relatively thin gauge wire, so as to minimize the ability of the shield 50 to apply a compressive force if the shield touches the table top (which as discussed above, can impair the ability of cover 22 to impart loads onto the sound reducing members 30 and port cover 38). As one preferred example, the wire gauge is preferably less than about ten-thousandths of an inch. Preferably, the mesh spacing is less than about one inch. However, still further improvement can be made from meshes of less than one-half inch, and still more preferably for meshes less than one-quarter inch. Most preferably, the mesh should have a size of less than about one-tenth of an inch. However, still further embodiments contemplate the use of sheet or foil fabricated from an electrically conductive material, and still further from electrically conductive materials that are deposited on the interior or exterior of the cover 22. It is further understood that the shield 50, regardless of construction type, can be placed on the outside of the assembly 20. In such embodiments, and especially if copper is selected as the conductive material, then the outside will have a pattern and color that will be attractive to some users.

Referring to FIG. 3, it can be seen that the shield 50 extends from base 22c of cover 22 to the central portion 26 (as seen in FIG. 4) to the base 50c on the opposite side of the central region. In some embodiments, the shield extends over the top of the sound reducing members 30, although in yet other embodiments the top portion 50a of the shield is attached to the periphery of central section 26 of cover 22, thus forming an interior pocket (not shown in FIG. 3) between the top 50a of shield 50 and the top 22a of cover 22. In some embodiments, one or more of the sound reducing members or the microphone port cover can be placed within this pocket formed by the inner EMI shield. In yet other embodiments, such as those in which the EMI shield 50 is placed externally to the cover 22, this pocket between the shield and cover is exterior to the cover.

Although what has been shown and described in FIG. 3 is a substantially continuous shield 50, yet other embodiments of the present invention contemplate segmented shields. As one example, shield 50 can have a top portion 50a that is separate from the middle portion 50b, which in turn is separate from the base portion 50c. In such embodiments, the segmentation of the shield is useful in maintaining the inability of assembly 20 to maintain compressive loads, and instead to remain in tension. In such segmented versions of the shield, it is preferable that the shield segments overlap and remain loosely in electrical conductivity, so as to achieve an improved shielding effect for the reception or transmission of the wireless signal.

Figure 5:
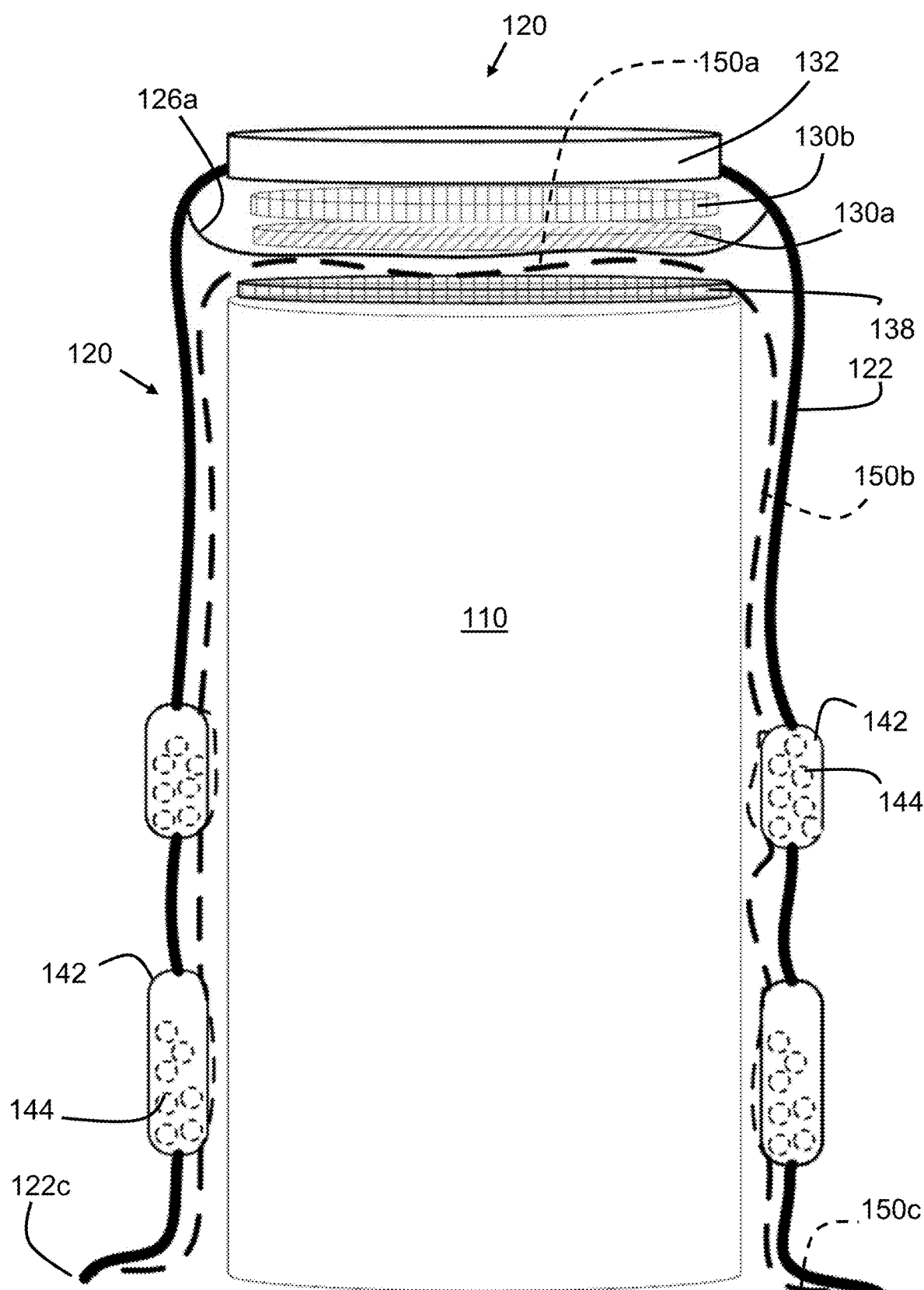

FIG. 5 shows an isolation assembly 120 according to another embodiment of the present invention. Assembly 120 is similar to assembly 20, except that the top 150a of shield 150 does not include one or more of the members 130 or 138. As shown, both of the separate sound reducing members 130a and 130b are contained within a top pocket 126a that is attached to the central region 126 of cover 122. Preferably, each of the sound reducing members 130a and 130b are contained loosely within pocket 126a. It can be further seen that in some embodiments the top 150a of shield 150 extends between the sound reducing members and the microphone port cover 138.

FIG. 5 shows an additional feature for maintaining compression of port cover 138 and conformance of members 130 to the shape of the top of device 110. This additional feature is a substantially rigid plate 132 that is located in some embodiments to the exterior of cover 122. This plate 132 is preferably fabricated from a relatively heavy material, such as steel. Further, in those embodiments in which the plate 132 is rigid, the top surface of the plate 132 is available for decoration or any type of imprinting or coding, whether for aesthetic purposes or EMI shielding purposes.

In still further embodiments, it is contemplated that the base 122c of cover 122 can be adapted and configured to provide a tight fit around the bottom of device 110. In some embodiments, the base 122c can include a drawstring (not shown) by which the user can tightly draw the base of the cover around the base of the device 110. In still further embodiments, base 150 and/or a portion of midsection 122b or top 122a can include an elastic band (not shown) which can be useful in tightly gathering the EMI shield around the periphery of the device 110.

Figure 6:
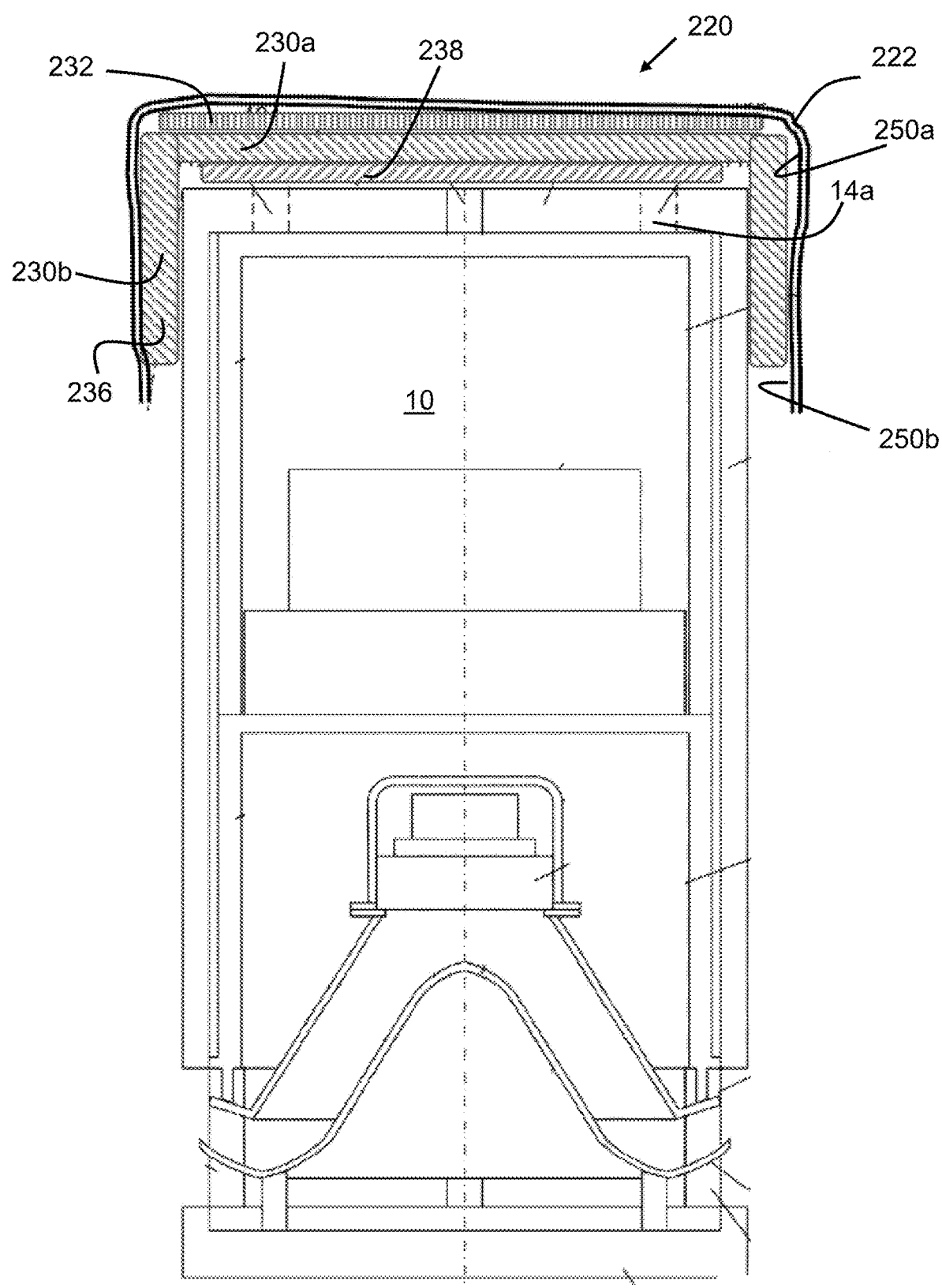
Figure 7:
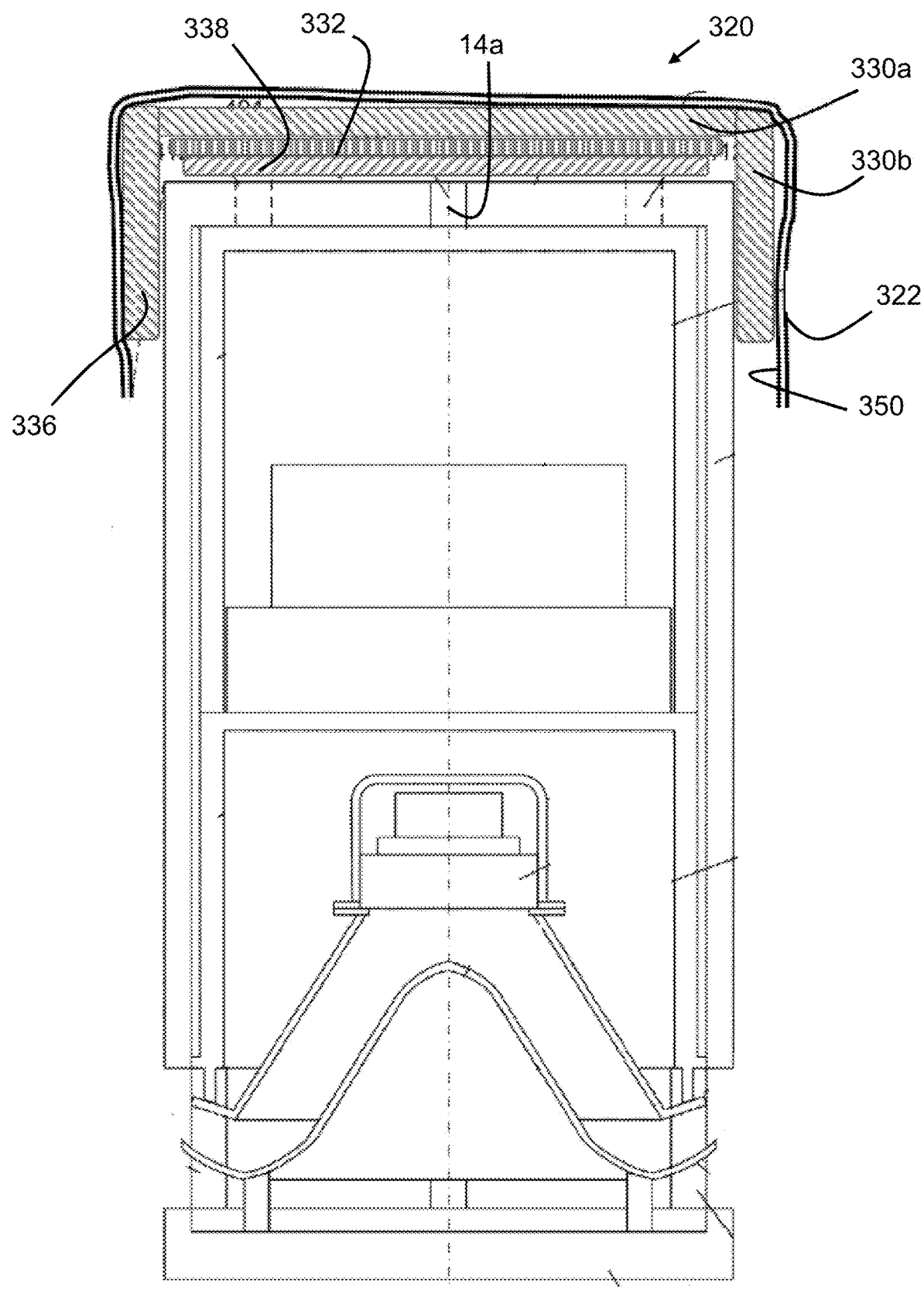

FIGS. 6 and 7 show still further embodiments of isolation assemblies 220 and 320, respectively, according to further embodiments of the present invention. Referring to FIG. 6, it can be seen that in some embodiments the isolation assembly can have a more distinct shape created by an underlying casing structure. Assembly 220 includes an open cylinder shape casing 236 comprising a plurality of sound reducing members. In one embodiment, a generally circular member 230a is coupled to a more cylindrical shape 230b. Preferably, the underlying structure of the casing 236 closely fits to the at least the top 10a of a device 10 after it is placed on the top 10a. Casing 236 can be fabricated from any type of material, and preferably the sides of it are sufficiently elastic to be stretched over the top 10a of a device 10. In some embodiments, casing 236 is a one piece, molded structure. Although the casing 236 shown in FIG. 6 is shown as being generally in the shape of an open cylinder, it is appreciated that the downward-extending sides of casing 236 can be of a variety of shapes, and adapted and configured to fit one or more of the devices shown in FIG. 1 or still other electroacoustic devices. For example, in one embodiment, the top of the casing 236 is generally circular, but the downwardly-depending walls can be oblong or elliptical in its unstressed state, but subsequently stretched to fit the top of a device as shown in FIG. 6.

In still further embodiments, assembly 220 includes a cover 222 extending over the exterior of device 220, with an electrically conductive shield 250 placed within the inner surface of the cover 222 (as shown), or placed externally to cover 222 (not shown). In still further embodiments, the electrically conductive shield 250 can comprise materials that are placed on the inner and/or outer surfaces of the sound absorbing members 230, or further still can comprise electrically conductive materials that are molded into the sound absorbing materials 230 or the casing 236.

FIG. 7 shows a variation of the assembly 220. Assembly 320 includes a plate 332 placed on top of a microphone port cover 338. By this direct placement of a preferably rigid weighting member on top of the port cover 338, the port cover 338 is better forced into the microphone ports 14a.

Various aspects of different embodiments of the present invention are expressed in paragraphs Z1, Z2, and Z3 and as follows:

Z1. Once aspect of the present invention pertains to an apparatus for covering a device. The apparatus preferably includes a cover comprising a first material adapted and configured to be placed on the top of an electronic device, the material being substantially unable to resist compression, the cover having a central area. The apparatus preferably includes a sound isolating member attached to said cover at the central area. The apparatus preferably includes at least one weight attached to the first pliable material. The apparatus preferably includes a shield comprising an electrically conductive material.

Z2. Another aspect of the present invention pertains to an apparatus to place on a wirelessly communicating electronic device having a top. The apparatus preferably includes a cover comprising a first weighted material adapted and configured to conform to the top of an electronic device and cover the microphone, the cover having a central area. The apparatus preferably includes a shield comprising an electrically conductive material adapted and configured to impede the wireless communication.

Z3. Yet another aspect of the present invention pertains to an apparatus to place on a wirelessly communicating electronic device including a microphone to detect ambient sound. The apparatus preferably includes a sound isolating casing comprising a material adapted and configured to generally fit to the top and sides of an electronic device and cover the microphone. The apparatus preferably includes a shield comprising an electrically conductive material adapted and configured to impede the wireless communication, the shield being attached to said casing.

Yet other embodiments pertain to any of the previous statements Z1, Z2, or Z3, which are combined with one or more of the following other aspects. It is also understood that any of the aforementioned Z paragraphs include listings of individual features that can be combined with individual features of other Z paragraphs.

Which further comprises at least two discrete weights, and each said discrete weight is attached to said cover on a side of the central area opposite of the other said discrete weight.

Wherein said cover includes a peripheral area surrounding the central area, the peripheral area includes a plurality of spaced apart compartments, and each compartment includes within it a corresponding discrete weight.

Wherein said plurality is circumferentially spaced around the central area at a first radius.

Wherein said plurality of spaced apart compartments is a first plurality, and wherein said cover includes a second plurality of spaced apart compartments, and each of said second plurality of compartments includes within it a corresponding discrete weight, and said second plurality is circumferentially spaced around the central area at a second radius greater than the first radius.

Wherein said shield is a first shield, and which further comprises a second shield comprising an electrically conductive material and attached to said cover, said first shield and said second shield being in electrical communication.

Wherein said cover has a non-central area surrounding the central area, and said second shield extends over the non-central area.

Wherein the electrically conductive material of said shield comprises copper or aluminum.

Wherein the electrically conductive material of said shield is a mesh having a mesh size less than about one inch.

Wherein the electrically conductive material of said shield is a mesh having a mesh size less than about one half inch.

Wherein the electrically conductive material of said shield is a mesh having a mesh size less than about one quarter inch.

Wherein the electrically conductive material of said shield is a mesh having a mesh size less than about one tenth of an inch.

Wherein the electronic device has a shape, said sound isolating member has a weight and a shape, and the shape of said sound isolating member conforms by its own weight to the shape of the top of the electronic device.

Wherein said sound isolating member has a shape with a planform area, and said sound isolating member is fabricated from a second resilient material having a density such that said sound isolating member has an area specific weight of more than about one half pound per square foot.

Wherein said sound isolating member is adapted and configured to behave structurally as a membrane.

Wherein said cover includes a pocket in the central area, and said sound isolating member is placed in the pocket.

Wherein said sound isolating member is loose within the pocket.

Wherein said sound isolating member is a first sound isolating member and which further comprises a second sound isolating member, said first and second members being separate from one another.

Wherein said sound isolating member comprises an elastomeric material.

Wherein said sound isolating member comprises an butyl rubber.

Wherein said sound isolating member has a durometer less than about Shore A 40.

Wherein said sound isolating member has a durometer less than about Shore 00 40.

Wherein said casing is in the shape of an open cylinder.

Wherein said casing includes a central circular region and a peripheral wall, the peripheral wall defining an opening with a cross sectional area smaller than cross sectional area of the electronic device, the wall being constructed with a material that can readily and repeatedly be stretch over the electronic device without damage to the wall.

Wherein said casing has an inner surface adapted and configured for covering the microphone, and the inner surface has a durometer less than about Shore A 40.

Wherein the inner surface has a durometer less than about Shore 00 40

Which further comprises a rigid plate on top of said casing.

While the inventions have been illustrated and described in detail in the drawings and foregoing description, the same is to be considered as illustrative and not restrictive in character, it being understood that only certain embodiments have been shown and described and that all changes and modifications that come within the spirit of the invention are desired to be protected.

What is claimed is:

1. An apparatus for isolating an electronic device, comprising:
    a cover comprising a first pliable material adapted and configured to conform to the top of an electronic device, said pliable material being substantially unable to resist compression, said cover having a central area;
    a sound isolating member attached to said cover at the central area;
    a plurality of discrete weights attached to said first pliable material; and
    a shield comprising an electrically conductive material, said shield extending over the central area.

2. The apparatus of claim 1, which further comprises at least two discrete weights, and each said discrete weight is attached to said cover on a side of the central area opposite of the other said discrete weight.

3. The apparatus of claim 1 wherein said cover includes a peripheral area surrounding the central area, the peripheral area includes a plurality of spaced apart compartments, and each compartment includes within it a corresponding discrete weight.

4. The apparatus of claim 3 wherein said plurality is circumferentially spaced around the central area at a first radius.

5. The apparatus of claim 4 wherein said plurality of spaced apart compartments is a first plurality, and wherein said cover includes a second plurality of spaced apart compartments, and each of said second plurality of compartments includes within it a corresponding discrete weight, and said second plurality is circumferentially spaced around the central area at a second radius greater than the first radius.

6. The apparatus of claim 1 wherein the electronic device has a shape, said sound isolating member has a weight and a shape, and the shape of said sound isolating member conforms by its own weight to the shape of the top of the electronic device.

7. The apparatus of claim 1 wherein said sound isolating member has a shape with a planform area, and said sound isolating member is fabricated from a second resilient material having a density such that said sound isolating member has an area specific weight of more than about one half pound per square foot.

8. The apparatus of claim 1 wherein said sound isolating member is adapted and configured to behave structurally as a membrane.

9. The apparatus of claim 1 wherein said cover includes a pocket in the central area, and said sound isolating member is placed in the pocket.

10. The apparatus of claim 9 wherein said sound isolating member is loose within the pocket.

11. The apparatus of claim 1 wherein said sound isolating member is a first sound isolating member and which further comprises a second sound isolating member, said first and second members being separate from one another.

12. The apparatus of claim 1 wherein said sound isolating member comprises an elastomeric material.

13. The apparatus of claim 12 wherein said sound isolating member comprises a butyl rubber.

14. The apparatus of claim 12 wherein said sound isolating member has a durometer reading less than about Shore A 40.

15. The apparatus of claim 14 wherein said sound isolating member has a durometer reading less than about Shore 00 40.

16. The apparatus of claim 1 wherein said shield comprises an electrically conductive material of at least one of copper or aluminum.

17. The apparatus of claim 1 wherein said shield comprises an electrically conductive material including a mesh having a mesh size less than about one inch.

18. The apparatus of claim 17 wherein the electrically conductive material of said shield includes a mesh having a mesh size less than about one half inch.

19. The apparatus of claim 17 wherein the electrically conductive material of said shield includes a mesh having a mesh size less than about one quarter inch.

20. The apparatus of claim 17 wherein the electrically conductive material of said shield includes a mesh having a mesh size less than about one tenth of an inch.

21. An apparatus to place on a wirelessly communicating electronic device including a microphone to detect ambient sound and having a top, comprising:
    a sound isolating casing comprising a first resilient material adapted and configured to fit to the top and sides of an electronic device and cover the microphone; and
    a shield comprising an electrically conductive material adapted and configured to impede the wireless communication, said shield being attached to said casing;
    wherein said casing has an inner surface adapted and configured for covering the microphone, and the inner surface has a durometer reading less than about Shore A 40.

22. The apparatus of claim 21 wherein said casing is in the shape of an open cylinder.

23. The apparatus of claim 21 wherein the inner surface has a durometer reading less than about Shore 00 40.

24. The apparatus of claim 21 which further comprises a rigid plate on top of said casing.

25. The apparatus of claim 21 wherein the electrically conductive material of said shield comprises at least one of copper or aluminum.

26. The apparatus of claim 21 wherein the electrically conductive material of said shield is a mesh having a mesh size less than about one inch.

27. The apparatus of claim 26 wherein the electrically conductive material of said shield is a mesh having a mesh size less than about one half inch.

28. The apparatus of claim 27 wherein the electrically conductive material of said shield is a mesh having a mesh size less than about one quarter inch.

29. The apparatus of claim 28 wherein the electrically conductive material of said shield is a mesh having a mesh size less than about one tenth of an inch.

30. The apparatus of claim 21 which further comprises a plurality of discrete weights attached to said sound isolating casing.

* * * * *